United States Patent [19]
Chi et al.

[11] Patent Number: 5,587,596
[45] Date of Patent: Dec. 24, 1996

[54] SINGLE MOS TRANSISTOR ACTIVE PIXEL SENSOR CELL WITH AUTOMATIC ANTI-BLOOMING AND WIDE DYNAMIC RANGE

[75] Inventors: Min-Hwa Chi; Albert Bergemont, both of Palo Alto; Hosam Haggag, Mountain View, all of Calif.

[73] Assignee: National Semiconductor Corporation, Santa Clara, Calif.

[21] Appl. No.: 531,582

[22] Filed: Sep. 20, 1995

[51] Int. Cl.$^6$ ........................................ H01L 31/062
[52] U.S. Cl. .................... 257/223; 257/290; 257/291; 257/292; 257/445; 257/462
[58] Field of Search ......................... 257/223, 233, 257/236, 239, 249, 250, 257, 258, 290, 291, 292, 294, 445, 448, 462; 377/60

[56] References Cited

U.S. PATENT DOCUMENTS 5,191,398  3/1993  Mutoh ................................ 257/216
5,289,023  2/1994  Mead ................................. 257/291

OTHER PUBLICATIONS

"A Randon Access Photodiode Array for Intelligent Image Capture", IEEE Transactions of Electron Devices, vol. 38, No. 8, Aug. 1991, Pecht et al.
Fossum, Eric R., "Active–Pixel Sensors Challenge CCDs", Laser Focus World, Jun. 1993, pp. 83–87.
Dickinson, A. et al., "tp 13.5: A 256×256 CMOS Active Pixel Image Sensor with Motion Detection", ISSCC95/ SESSION 13/IMAGE SENSORS AND SYSTEMS/ PAPER TP 1., 1995.

*Primary Examiner*—Minhloan Tran
*Attorney, Agent, or Firm*—Limbach & Limbach L.L.P.

[57] ABSTRACT

The size of an active pixel sensor cell is reduced by utilizing a single MOS transistor formed in a well to perform the functions conventionally performed by a photogate/photodiode, a sense transistor, and an access transistor. Light energy striking the well varies the potential of the well which, in turn, varies the threshold voltage of the transistor. As a result, the current sourced by the transistor is proportional to the received light energy.

12 Claims, 2 Drawing Sheets

SINGLE MOS TRANSISTOR ACTIVE PIXEL SENSOR CELL WITH AUTOMATIC ANTI-BLOOMING AND WIDE DYNAMIC RANGE

BACKGROUND OF THE INVENTION

1. Field of the Invention.

The present invention relates to active pixel sensor cells and, more particularly, to a single MOS transistor active pixel sensor cell that provides automatic anti-blooming and wide dynamic range.

2. Description of the Related Art.

Conventional imaging circuits rely on charge-coupled devices (CCDs) to convert a pixel of light energy into an electrical signal that represents the intensity of the light energy. In general, CCDs utilize a photogate to collect the light energy, and a series of electrodes to transfer the charge collected at the photogate to an output sense node.

Although CCDs have many strengths, which include a high sensitivity and fill-factor, CCDs also suffer from a number of weaknesses. Most notable among these weaknesses, which include limited readout rates and dynamic range limitations, is the difficulty in integrating CCDs with CMOS-based microprocessors.

To overcome the limitations of CCD-based imaging circuits, more recent imaging circuits use active pixel sensor cells to convert a pixel of light energy into an electrical signal. With active pixel sensor cells, a conventional photogate is typically combined with a number of active transistors which, in addition to forming an electrical signal, provide amplification, readout control, and reset control.

FIG. 1 shows an example of a conventional CMOS active pixel sensor cell 10. As shown in FIG. 1, cell 10 includes a photogate PG, a reset transistor RT, and a transfer gate TX formed between the source of reset transistor RT and photogate PG. In addition, active pixel sensor cell 10 also includes a sense transistor ST, whose gate is connected to the source of reset transistor RT, and an access transistor AT.

Operation of active pixel sensor cell 10 is performed in two steps; image integration, where the light energy is collected by photogate PG, and signal readout, where the collected energy is converted into an electrical signal and read out.

During image integration, a positive voltage (5 volts) is applied to the photogate PG, while a smaller positive voltage (2.5 volts) is applied to the transfer gate TX. Under these conditions, light energy, in the form of photons, strikes the substrate under photogate PG which, in turn, creates a number of electron-hole pairs. Due to the positive voltage applied to photogate PG, the photogenerated electrons are collected under the photogate PG.

At the same time, a positive voltage (2.5 volts) is applied to the gate of reset transistor RT to control anti-blooming by allowing excess charge to flow to the drain of reset transistor RT. In addition, access transistor AT is turned off.

Following image integration, active pixel sensor cell 10 is read out by first enabling access transistor AT. Next, the source of reset transistor RT is reset by briefly pulsing the gate of reset transistor RT with a positive voltage (5 volts). This resets the source of reset transistor RT to an initial voltage (approximately 3.5 volts).

Following this, photogate PG is pulsed low (0 volts) to transfer the signal charge stored under photogate PG to the source of reset transistor RT which, in turn, modulates the current flowing through sense transistor ST.

One of the principal advantages of active pixel sensor cell 10, in addition to providing amplification and reduced size, is that the fabrication process is inherently CMOS since only MOS transistors are utilized. However, although cell 10 is smaller than conventional CCDs, there is still a need to further reduce the size of active pixel sensor cells.

SUMMARY OF THE INVENTION

Conventionally, the size of an active pixel sensor cell is defined in part by the space requirements of the photogate or photodiode used to collect light energy, the sense transistor used to convert the collected light energy into an electrical signal, and the access transistor used to control the output of the signal. The present invention, however, substantially reduces the size of an active pixel sensor cell by integrating each of these functions into a single MOS transistor.

In the present invention, an active pixel sensor cell includes a first well region formed in a substrate, and a pixel transistor. The first well region is formed so that the first well region has the opposite conductivity type of the substrate. The pixel transistor includes spaced-apart drain and source regions that are formed in the first well region to define a first channel region therebetween, and a first conductive gate which is formed over the first channel region and separated therefrom by a dielectric material. The drain and source regions are formed to have the opposite conductivity type of the first well region. In addition, the active pixel sensor cell of the present invention also includes a second well region, which is formed in the substrate a distance apart from the first well region to define a second channel region therebetween, and a second conductive gate which is formed over the second channel region and separated therefrom by a dielectric material. The second well region is formed to have the same conductivity type as the first well region.

A better understanding of the features and advantages of the present invention will be obtained by reference to the following detailed description and accompanying drawings which set forth an illustrative embodiment in which the principals of the invention are utilized.

DETAILED DESCRIPTION

Figure 1:
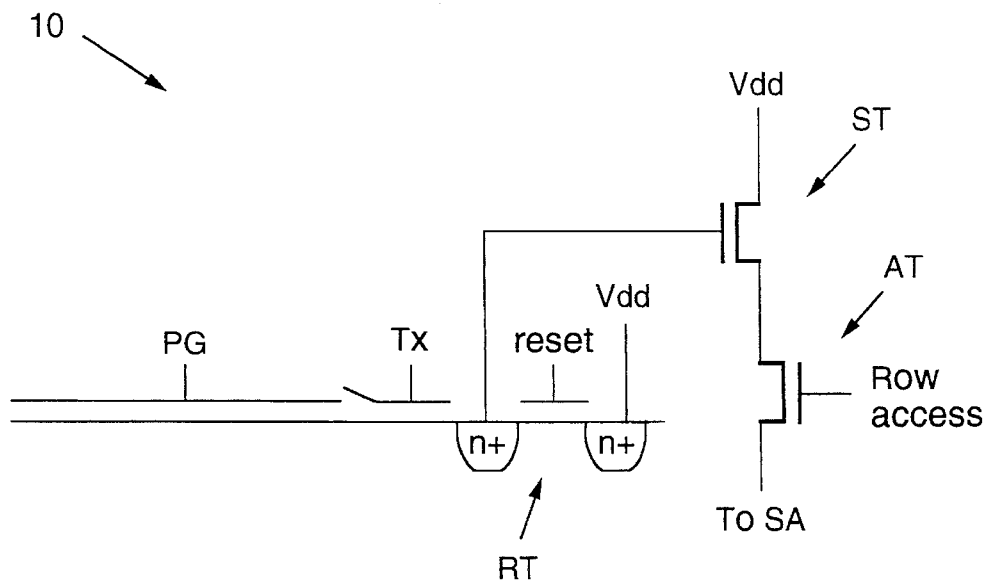
FIG. 1 is a cross-sectional diagram illustrating a conventional active pixel sensor cell 10.
Figure 2:
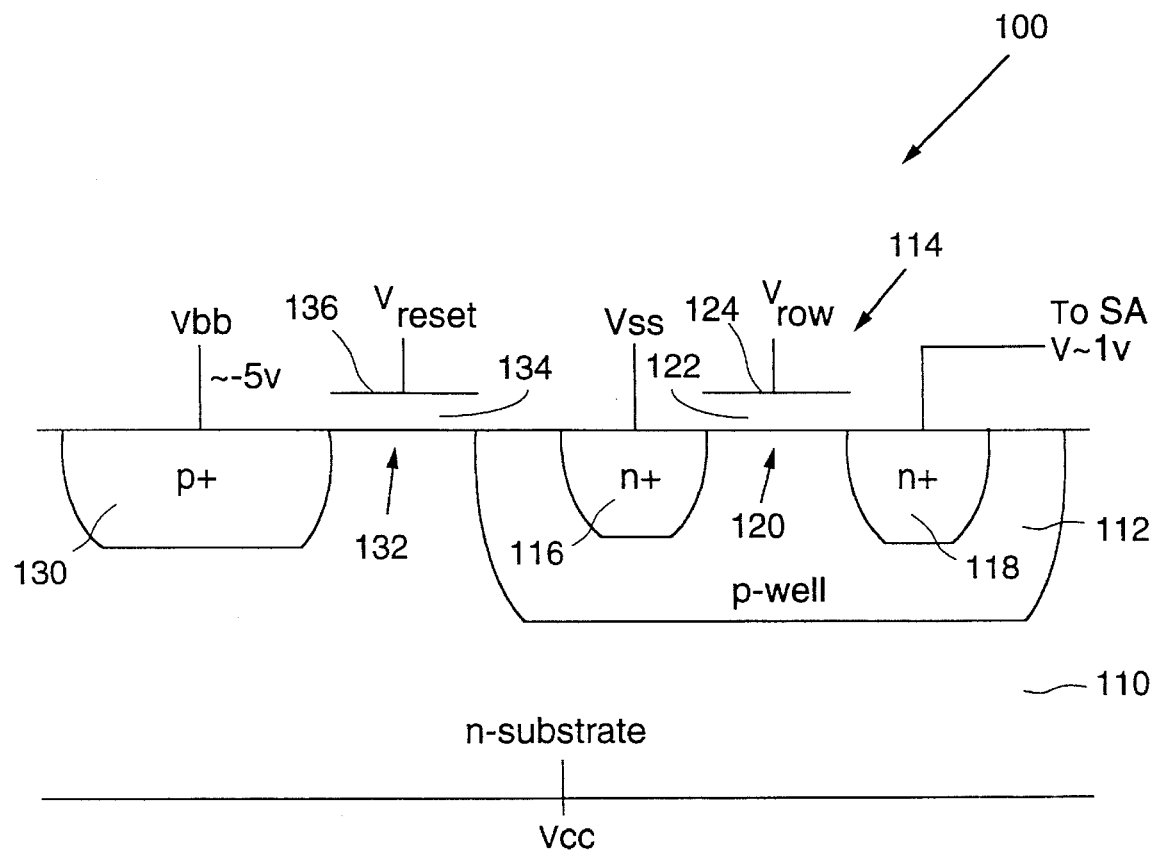
FIG. 2 is a cross-sectional diagram illustrating an active pixel sensor cell 100 in accordance with the present invention.

FIG. 2 shows a cross-sectional diagram of an active pixel sensor cell 100 in accordance with the present invention. As shown in FIG. 2, cell 100 includes a p-well 112, which is formed in a semiconductor substrate 110 of n-type conductivity, and a pixel transistor 114, which is formed in p-well 112. Pixel transistor 114, which outputs the image information for a single pixel, includes spaced-apart n-type source and drain regions 116 and 118, respectively, and a channel region 120 formed between drain and source regions 116 and 118. In addition, pixel transistor 114 also includes a layer of dielectric material 122 formed over channel region 120, and a conductive gate 124 formed over the layer of dielectric material 122.

As further shown in FIG. 2, cell 100 additionally includes a p-well 130, which is formed in semiconductor substrate 110 a distance apart from well 112, a channel region 132, which is formed between wells 112 and 130, a layer of dielectric material 134 formed over channel region 130, and a conductive gate 136 formed over the layer of dielectric material 134.

In operation, prior to image integration, the voltage on p-well 112 is reset. In accordance with the present invention, the voltage on p-well 112 is reset by taking advantage of the p-channel parasitic transistor that is formed between p-wells 112 and 130.

Thus, by applying a negative voltage Vbb to p-well 130, a reset voltage Vreset to conductive gate 136 which is sufficient to form a conductive channel, and a voltage to the gate of pixel transistor 114 which is sufficient to turn off transistor 114, the voltage on p-well 112 will drop to a value which is approximately equal to the negative voltage Vbb. After the voltage on p-well 112 has dropped, p-well 112 is floated by removing the reset voltage Vreset which, in turn, eliminates the conductive channel formed between p-wells 112 and 130. Thus, the junction between p-well 112 and n-type substrate 110 is initially reverse-biased by lowering the voltage on p-well 112 with respect to the voltage on substrate 110 which is connected to a positive voltage Vcc.

Once the voltage on p-well 112 has been reset, the next step is to begin image integration. During image integration, photons strike the surface of p-well 112 and, as a result, create a number of electron-hole pairs. The number of created electron-hole pairs is a function of the intensity of the received light energy.

The photogenerated electrons, in turn, are attracted to the junction between p-well 112 and n-type substrate 110 where, due to the increased energy of the electrons, many of these carriers diffuse over to substrate 110. This loss of electrons, in turn, raises the potential of p-well 112.

As the potential of p-well 112 rises, the threshold voltage of pixel transistor 114 falls due to the so-called "body-effect". As a result, when pixel transistor 114 is read, the magnitude of the current output by drain region 118 will be approximately proportional to the change in the potential of p-well 112 which, in turn, is proportional to the number of photons striking the surface of p-well 112.

For example, when the source region 116 is grounded, a read voltage of approximately one volt is applied to drain region 118, and an access voltage Vrow is applied to conductive gate 124, the current output from pixel transistor 114 will have one magnitude in low light conditions, and a much larger magnitude in bright light.

In addition, when p-well 112 is exposed to very bright light, the present invention automatically provides anti-blooming control, which limits the maximum potential that p-well 112 can reach, when p-well 112 becomes forward-biased with respect to source 116.

Although the maximum voltage that p-well 112 can reach is limited, the minimum voltage that p-well 112 can be reset to is only limited by the voltage Vbb that is connected to p-well 130. As a result, when Vbb is set to a negative five volts, for example, active pixel sensor cell 100 provides a dynamic range of approximately 5.7 volts. Similarly, when Vbb is set to a negative ten volts, active pixel sensor cell 100 provides a dynamic range of approximately 10.7 volts. Thus, the present invention provides a wide dynamic range that is adjustable.

Another advantage provided by the present invention is that by varying the doping level and doping profile of p-well 112, the threshold voltage of transistor may vary more sensitively or more linearly with respect to the p-well potential which rises in response to the received light energy. As a result, active pixel sensor cell 100 provides the ability to tailor the magnitude of the current output by pixel transistor 114 to the photo intensity of the received light.

Figure 3:
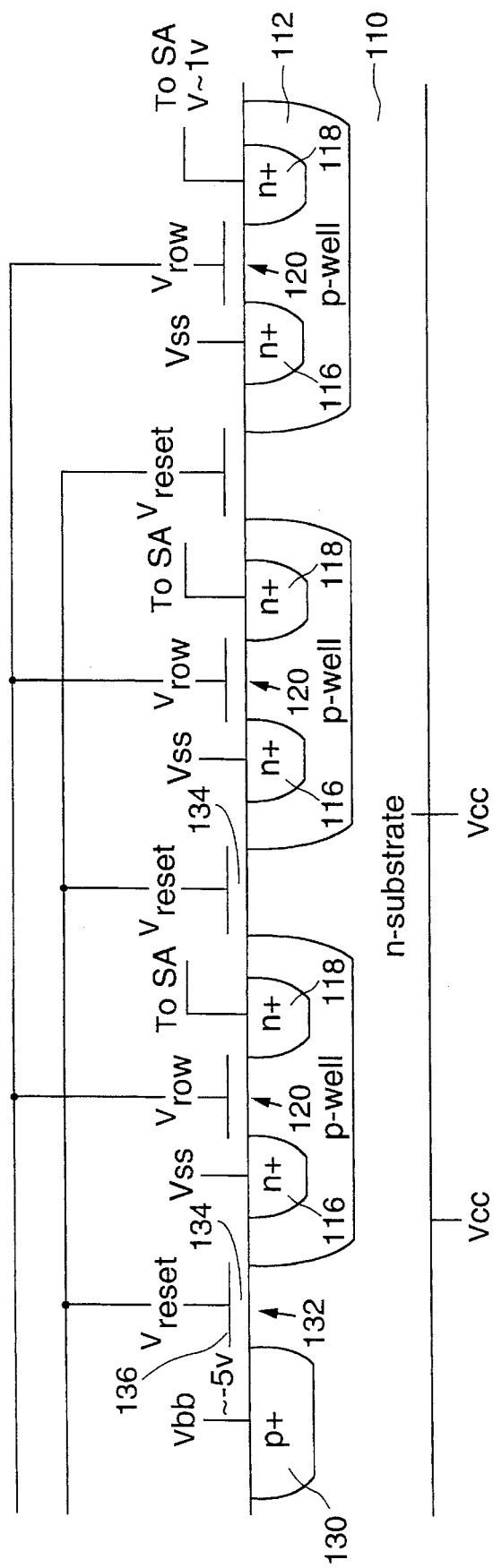
FIG. 3 is a cross-sectional diagram illustrating a row of three active pixel sensor cells.

In addition, a row of active pixel sensor cells can be formed as part of an array by only adding additional p-wells and pixel transistors. FIG. 3 shows a cross-sectional diagram that illustrates a row of three active pixel sensors cells. As shown in FIG. 3, only one p-well 130 needs to be used for each row of active pixel sensors. Thus, when a negative voltage Vbb is applied to p-well 130 and a reset voltage Vreset is applied to all of the conductive gates 136 in the row, all of the p-wells 112 in the row are reset to the negative voltage vbb at the same time.

Thus, in accordance with the present invention, an active pixel sensor cell has been described which provides a substantially reduced size (only one MOS transistor), automatic anti-blooming, and a wide dynamic range. In addition, because only MOS compatible structures are utilized, the present invention is easily integratable with standard CMOS fabrication processes.

It should be understood that various alternatives to the embodiment of the invention described herein may be employed in practicing the invention. For example, although the operation of the present invention has been described with respect to p-wells and an n-type pixel transistor, n-wells and a p-type pixel transistor may alternately be used.

Thus, it is intended that the following claims define the scope of the invention and that methods and structures within the scope of these claims and their equivalents be covered thereby.

What is claimed is:

1. An active pixel sensor cell formed in a semiconductor substrate of a first conductivity type, the cell comprising:

a first well region of a second conductivity type formed in the substrate;

a pixel transistor that includes spaced-apart drain and source regions of the first conductivity type formed in the first well region to define a first channel region therebetween, and a first conductive gate formed over the first channel region and separated therefrom by dielectric material, the first conductive gate connected to receive a row signal;

a second well region of the second conductivity type formed in the substrate a distance apart from the first well region to define a second channel region therebetween; and a second conductive gate formed over the second channel region and separated therefrom by dielectric material, the second conductive gate connected to receive a reset signal.

2. The cell of claim 1 wherein the first well region and the substrate form a photodiode.

3. The cell of claim 1 wherein the first conductivity type is n-type.

4. The cell of claim 3 wherein the second conductivity type is p-type.

5. A row of active pixel sensor cells formed in a semiconductor substrate of a first conductivity type, the row of cells comprising:

a plurality of spaced-apart first well regions of a second conductivity type formed in the substrate, each pair of adjacent first well regions defining a parasitic channel region therebetween;

a plurality of pixel transistors formed in the plurality of first well regions so that a pixel transistor is formed in each first well region, each pixel transistor including spaced-apart drain and source regions of the first conductivity type formed in the corresponding first well region to define a first channel region therebetween, and a first conductive gate formed over the first channel region and separated therefrom by dielectric material, the first conductive gate connected to receive a row signal;

a second well region of the second conductivity type formed in the substrate a distance apart from one of the first well regions to define a second channel region therebetween; and a second conductive gate formed over the second channel region and separated therefrom by dielectric material, the second conductive gate connected to receive a reset signal, and a plurality of third conductive gates formed over the parasitic channel regions so that a third conductive gate is formed over each parasitic channel region, each third conductive gate separated from the parasitic channel region by dielectric material and connected to receive the reset signal.

6. The cell of claim 5 wherein the first conductivity type is n-type.

7. The cell of claim 6 wherein the second conductivity type is p-type.

8. A method for converting light energy into a pixel signal with an active pixel sensor cell formed in a semiconductor substrate of a first conductivity type, wherein the active pixel sensor cell includes:

a first well region of a second conductivity type formed in the substrate;

a pixel transistor that includes spaced-apart drain and source regions of the first conductivity type formed in the first well region to define a first channel region therebetween, and a first conductive gate formed over the first channel region and separated therefrom by dielectric material, the first conductive gate connected to receive a row signal;

a second well region of the second conductivity type formed in the substrate a distance apart from the first well region to define a second channel region therebetween; and a second conductive gate formed over the second channel region and separated therefrom by dielectric material, the second conductive gate connected to receive a reset signal, the method comprising the steps of:

applying a first voltage to the substrate;

resetting the first well region so that the first well region to substrate junction is reverse biased; and applying a read voltage to the first conductive gate for a predefined time after the first well region is reset.

9. The method of claim 8 wherein the resetting step includes the steps of:

applying a second voltage to the second well region; and applying a reset voltage to the second conductive gate for a predefined time to reset the first well region.

10. The method of claim 9 wherein the second voltage is a negative voltage.

11. The method of claim 8 wherein the first voltage is a power supply voltage.

12. The method of claim 8 wherein the first well region is reset to a voltage which is less than the first voltage when the first well region is reset.

* * * * *